(12) United States Patent
Hwang et al.

(10) Patent No.: US 7,889,533 B2
(45) Date of Patent: Feb. 15, 2011

(54) SEMICONDUCTOR DEVICE USING MAGNETIC DOMAIN WALL MOVEMENT AND METHOD OF MANUFACTURING THE SAME

(75) Inventors: In-jun Hwang, Yongin-si (KR);
Sung-chul Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 520 days.

(21) Appl. No.: 11/727,689

(22) Filed: Mar. 28, 2007

(65) Prior Publication Data
US 2008/0094887 A1     Apr. 24, 2008

(30) Foreign Application Priority Data
Oct. 18, 2006    (KR)    ........................ 10-2006-0101577

(51) Int. Cl.
*G11C 19/08*    (2006.01)
(52) U.S. Cl. ................. 365/87; 257/421; 257/E27.006; 257/E43.001
(58) Field of Classification Search ................. 257/421, 257/E43.001, E27.006; 365/80, 87
See application file for complete search history.

(56) References Cited

U.S. PATENT DOCUMENTS

| | | | |
|---|---|---|---|
| 6,781,871 B2 | 8/2004 | Park et al. | |
| 6,834,005 B1 | 12/2004 | Parkin | |
| 6,970,379 B2 * | 11/2005 | Parkin | ......................... 365/173 |
| 7,315,470 B2 * | 1/2008 | Parkin | ......................... 365/173 |
| 2009/0316462 A1 * | 12/2009 | Xi et al. | ......................... 365/87 |
| 2010/0080034 A1 * | 4/2010 | Hung | ........................... 365/80 |
| 2010/0135058 A1 * | 6/2010 | Tsai | ............................. 365/80 |

FOREIGN PATENT DOCUMENTS

KR    10-2006-0013476 A    2/2006

OTHER PUBLICATIONS

Office Action dated Jun. 2, 2010 issued in corresponding Chinese Application No. 200710303545.X and English translation thereof.

* cited by examiner

*Primary Examiner*—Anh Phung
*Assistant Examiner*—Michael Lulis
(74) *Attorney, Agent, or Firm*—Harness, Dickey & Pierce

(57) ABSTRACT

A semiconductor device using a magnetic domain wall movement and a method of manufacturing the semiconductor device are provided. The semiconductor device includes a magnetic layer that is formed on a substrate and has a plurality of magnetic domains, and a unit that supplies energy to move a magnetic domain wall in the magnetic layer. The magnetic layer is formed parallel to the substrate, and includes a plurality of prominences and a plurality of depressions alternately formed along a lengthwise direction thereof. The magnetic layer has a stepped form that secures a reliable movement of the magnetic domain wall in units of one bit.

12 Claims, 9 Drawing Sheets

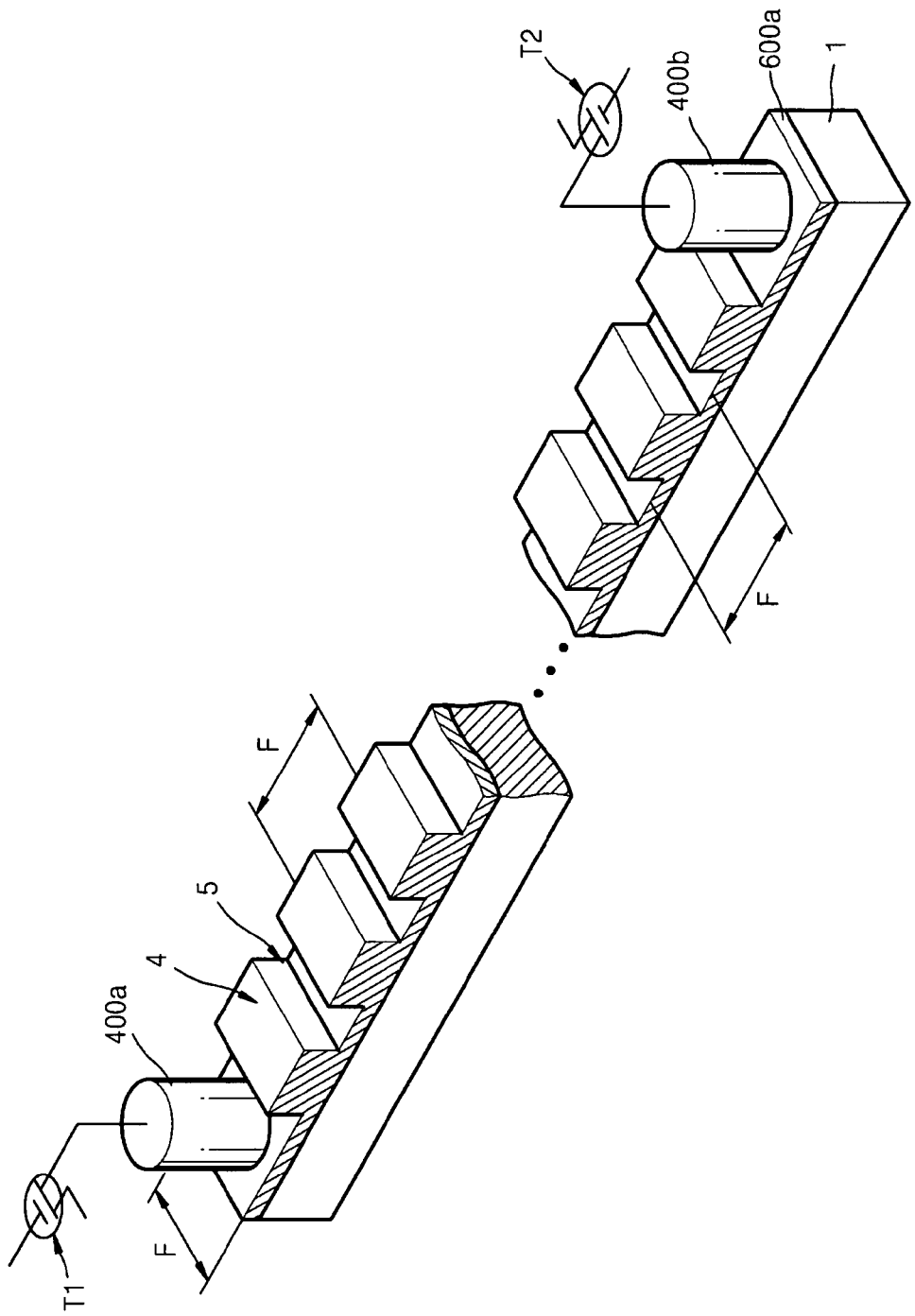

SEMICONDUCTOR DEVICE USING MAGNETIC DOMAIN WALL MOVEMENT AND METHOD OF MANUFACTURING THE SAME

CROSS-REFERENCE TO RELATED PATENT APPLICATIONS

This application claims priority from Korean Patent Application No. 10-2006-0101577, filed on Oct. 18, 2006, in the Korean Intellectual Property Office, the disclosure of which is incorporated herein in its entirety by reference.

BACKGROUND OF THE INVENTION

1. Field of the Invention

Apparatuses and methods consistent with the present invention relate to a semiconductor device and, more particularly, to a semiconductor device using magnetic domain wall movement and a method of manufacturing the same.

2. Description of the Related Art

Data storing devices are divided, for the most part, into volatile data storing devices that lose all recorded data when power is turned off and non-volatile data storing devices that keep data even when power is turned off.

Non-volatile data storing devices include a hard disc drive (HDD) and a non-volatile random access memory (RAM). The HDD includes a read and write head and a rotating data recording medium, and can store data of 100 gigabites or more. However, a device that has a rotating part like the HDD has a problem in that it wears down over time, and thus, there is a high possibility of operational failure, thereby reducing reliability.

Therefore, as a method of solving the drawbacks of the conventional non-volatile data storing devices as described above, much research and development with respect to a new data storing device that uses a magnetic domain wall movement has been carried out.

A magnetic domain in a magnetic substance and magnetic domain walls will now be described. Afterwards, a storing device that uses the magnetic domain and the magnetic domain walls will be described.

A minute magnetic region that constitutes a ferromagnetic body is named as a magnetic domain. The rotation of electrons in a magnetic domain, that is, the direction of magnetic moment is identical. The size and magnetization direction of a magnetic domain can be appropriately controlled by the shape, size and properties of a magnetic substance and external energy.

A magnetic domain wall is a boundary portion of a magnetic domain having a magnetization direction different from another magnetic domain. The magnetic domain wall can be moved by an external magnetic field or by a current applied to a magnetic substance.

The principle of the magnetic domain wall movement can be applied to data storing devices such as HDDs. That is, an operation of reading/writing data is possible when the magnetic domains magnetized so as to correspond to specific data in a magnetic substance are moved in order to pass through a read/write head. In this case, a reading/writing operation is possible without directly rotating a recording medium. Accordingly, the problems of wearing down and failure of conventional HDDs can be solved. An example of a data storing device to which the principle of magnetic domain wall movement is applied has been disclosed in U.S. Pat. No. 6,834,005 B1.

Also, the principle of magnetic domain wall movement can be applied to a memory such as a non-volatile RAM. That is, a non-volatile memory device that can write/read a data '0' or '1' can be realized using a principle whereby a voltage in a magnetic substance varies according to the movement of magnetic domain walls in the magnetic substance having magnetic domains magnetized in a specific direction and magnetic domain walls. In this way, since data can be read and written by varying the positions of the magnetic domain walls by flowing a specific current in a line type magnetic substance, a highly integrated device having a simple structure can be realized. Therefore, when the principle of magnetic domain wall movement is used, the manufacture of a memory having a very large storage capacity is possible. Examples of applying the principle of magnetic domain wall movement to a memory like RAM have been disclosed in Korean Patent Publication No. 10-2006-0013476 and U.S. Pat. No. 6,781,871B2.

However, the development of semiconductor devices that use the magnetic domain wall movement is still in the initial stages, and there are a few problems that have yet to be solved in order for them to be used in practice. One of the problems relates to reliability of the magnetic domain walls.

In order to obtain reliability in movement of magnetic domain walls, artificial notches are used. FIG. 1 is a plan view of a related art magnetic layer 200 having a plurality of notches formed therein, such as that disclosed in Korean Patent No. 10-2006-0013476. Reference numbers 20 and 25 in FIG. 1 respectively denote a magnetic domain and a magnetic domain wall. Although the magnetic domain wall 25 in FIG. 1 is depicted two-dimensionally, it is actually a three-dimensional entity.

Referring to FIG. 1, the notches are indents formed respectively in both sides of the related art magnetic layer 200, and function to pin the movement of magnetic domain walls. That is, the notches allow the magnetic domain wall to move in units of 1 bit.

However, the forming of notches in the magnetic layer having a width and thickness of only a few tens of nanometers is very difficult. It is more difficult to form notches with uniform distances, sizes, and shapes. If the distances, sizes and shapes of the notches are non-uniform, the intensity of the magnetic field pinning the movement of the magnetic domain wall (that is, the intensity of the pinning magnetic field) will vary, so that a corresponding device's characteristics are not uniform.

Also, when notches are formed parallel to a substrate, it is difficult to reduce the distance between the notches due to the limitations of an exposing process. This equates to a difficulty in reducing the bit size.

Therefore, high integration of a device and the reliable movement of magnetic domain walls are difficult to attain when notches are used.

SUMMARY OF THE INVENTION

Exemplary embodiments of the present invention provide a semiconductor device that uses a magnetic domain wall movement having a reliable movement of a magnetic domain wall, while avoiding the notch-induced problems.

The present invention also provides a method of manufacturing the above semiconductor device.

According to an aspect of the present invention, there is provided a semiconductor device including: a magnetic layer disposed on a substrate and having a plurality of magnetic domains; and a unit which supplies energy to move a magnetic domain wall in the magnetic layer, wherein the magnetic layer is formed parallel to the substrate, and includes a prominence and a depression formed alternatingly along a lengthwise direction of the magnetic layer.

A plurality of insulating layer patterns are further disposed between the substrate and the prominence. When an insulating pattern is provided between the substrate and the prominence, the magnetic layer may be formed conformally to surfaces of the substrate and the insulating layer patterns.

A portion of the substrate corresponding to the prominence may protrude. When a portion of the substrate corresponding to the prominence protrudes, the magnetic layer may be formed conformally to a surface of the substrate.

The substrate may include a planarized surface.

The prominences or depressions at both ends of the magnetic layer may have lengths that are greater than lengths of remaining prominences or depressions.

The lengths of the prominences or depressions at both ends of the magnetic layer may be 1-3 times of a width of the magnetic layer.

The remaining prominences and depressions may have pitches that are 1-2 times of a width of the magnetic layer.

A first electrode and a second electrode are respectively formed at one end and the other end of the magnetic layer for supplying a current to the magnetic layer.

According to another aspect of the present invention, there is provided a method of manufacturing a semiconductor device using a movement of a magnetic domain wall, the method including: forming a dummy pattern on a substrate; forming insulating layer patterns on the substrate to either side of the dummy pattern; removing the dummy pattern; and forming a magnetic layer on the substrate and the insulating layer patterns.

The dummy pattern may be a line type pattern. The dummy pattern may also be a multi-line pattern with uniformly-spaced lines.

The dummy pattern may be formed of silicon.

The insulating layer patterns may be formed of silicon nitride.

The method may further include etching upper portions of the dummy pattern and the insulating layer patterns, following the forming of the insulating layer patterns and prior to the removal of the dummy pattern.

According to a further aspect of the present invention, there is provided a method of manufacturing a semiconductor device using a movement of a magnetic domain wall, the method including: forming a magnetic layer with a uniform thickness on a substrate; forming a first pattern on the magnetic layer; forming a second pattern on the magnetic layer to either side of the first pattern; and etching a portion of the thickness of the magnetic layer using the second pattern as an etching mask.

The first pattern may be a line pattern across the magnetic layer.

The first pattern may be a multi-line pattern with uniformly-spaced lines.

The first pattern may be formed of silicon.

The second pattern may be formed of silicon nitride.

The method may further include etching upper portions of the first and second patterns, following the forming of the second pattern and prior to the removal of the first pattern.

The method may further include removing the second pattern after the etching the portion of the thickness of the magnetic layer.

BRIEF DESCRIPTION OF THE DRAWINGS

The above and other features and advantages of the present invention will become more apparent by describing in detail exemplary embodiments thereof with reference to the attached drawings, in which:

FIG. 7 is a partial perspective view of a semiconductor device using a magnetic domain wall movement according to another exemplary embodiment of the present invention.

DETAILED DESCRIPTION OF EXEMPLARY EMBODIMENTS OF THE INVENTION

Figure 1:
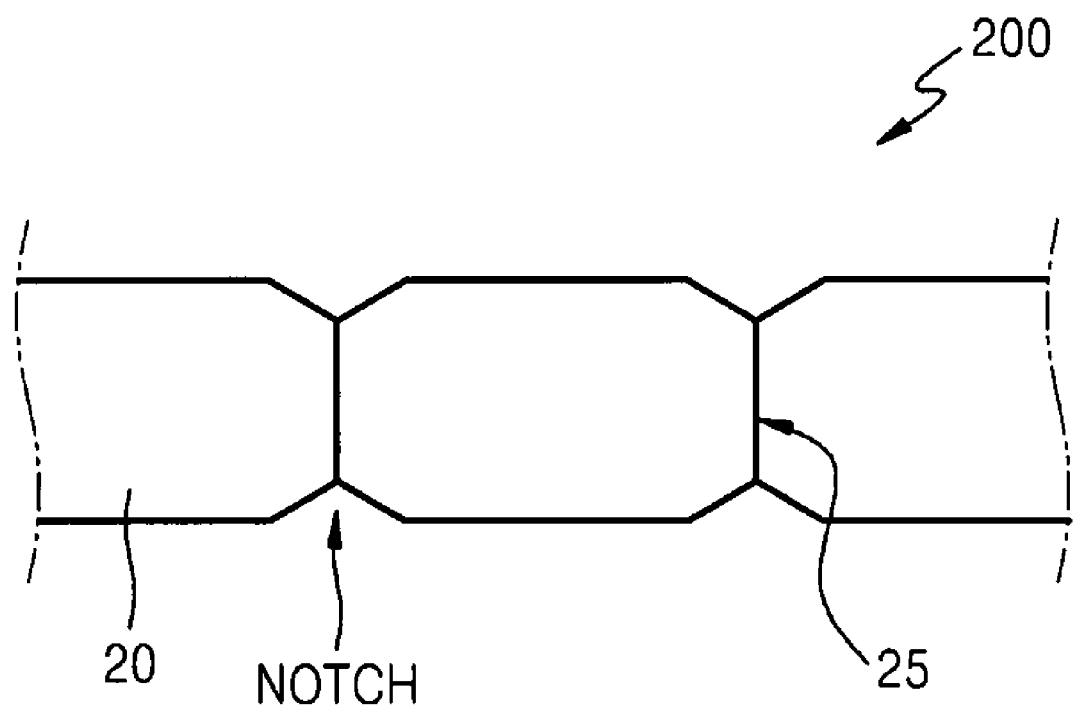
FIG. 1 is a plan view of a magnetic layer of the related art.

The semiconductor device using a magnetic domain wall movement and the manufacturing method of the semiconductor device consistent with the present invention will now be described more fully with reference to the accompanying drawings, in which exemplary embodiments of the invention are shown. In the drawings, the thicknesses of layers and regions are exaggerated for clarity.

Figure 2:
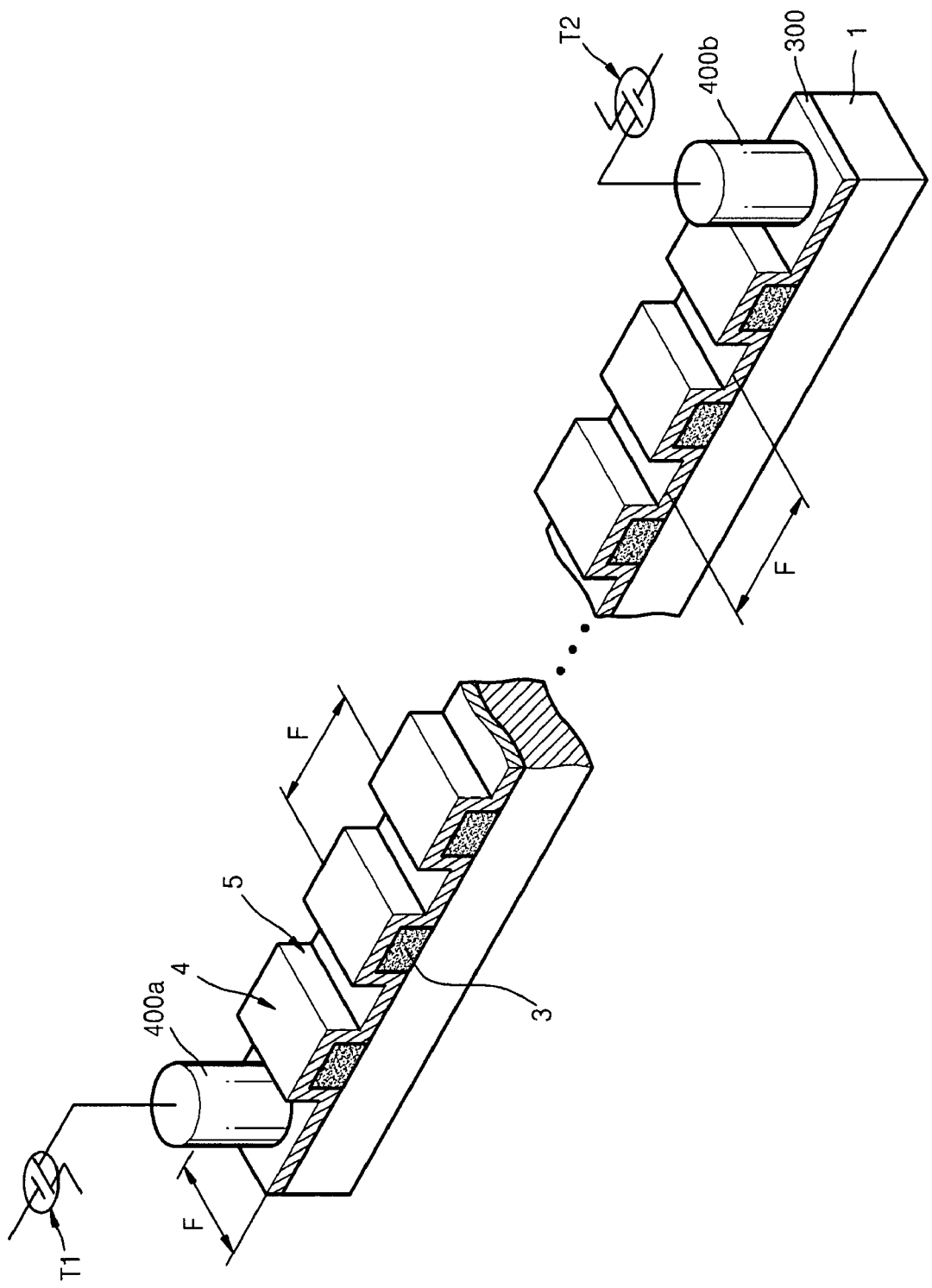
FIG. 2 is a partial perspective view of a semiconductor device using a magnetic domain wall movement, according to an exemplary embodiment of the present invention.

FIG. 2 is a partial perspective view of a semiconductor device using a magnetic domain wall movement, according to an exemplary embodiment of the present invention.

Referring to FIG. 2, a semiconductor device according to an exemplary embodiment of the present invention includes a magnetic layer 300 formed on a substrate 1 and having a plurality of magnetic domains, and a unit which may comprise first and second transistors T1 and T2 and supplies energy for moving magnetic domain walls (the walls of the magnetic domains) in the magnetic layer 300. The magnetic layer 300 is formed parallel to the substrate 1, and includes prominences 4 and depressions 5 alternately formed along a lengthwise direction of the magnetic layer 300. The widths of the prominence 4 and the depression 5 may be the same as the width of the magnetic layer 300.

A plurality of insulating layer patterns 3 may be formed between the substrate 1 and the prominence 4. In this case, the magnetic layer 300 is formed to conform with the surface of the substrate 1 and the insulating layer patterns 3. Instead of the interposition of the insulating layer patterns 3, portions of the substrate 1 corresponding to the prominences 4 may be made to protrude. In this case, the magnetic layer 300 is formed to conform with the surface of the substrate 1.

At least a plurality of one of the prominence 4 and the depression 5 may be provided.

The lengths of the prominences 4 or the depressions 5 disposed on either end of the magnetic layer 300 may be longer than the length of the other prominences 4 or depressions 5. Specifically, the lengths of the prominences or the depressions located at either end of the magnetic layer 300 may be 1-3 times the width of the magnetic layer 300. In FIG. 2, the lengths of the depressions at either end of the magnetic layer 300 are shown to be the same as the width of the magnetic layer 300.

The pitches of the other prominences and depressions may be the same as the width of the magnetic layer 300, or the pitches of the other prominences and depressions may be 1-2 times the width of the magnetic layer 300. Here, the pitch is the length between the centers of two adjacent prominences or two adjacent depressions.

Energy provided for moving the magnetic domain walls may be in the form of a current or a magnetic field.

In the case where the energy for moving the magnetic domain walls is a current, a first and a second electrode 400a and 400b may be respectively disposed at one end and the other end of the magnetic layer 300. The first and second electrodes 400a and 400b may be connected to the first and second transistors T1 and T2 respectively, or an alternating current generator (now shown). The first and second transistors T1 and T2 or the alternating current generator may constitute an example of a unit which supplies energy to move the magnetic domain wall with the first and second electrodes 400a and 400b.

Although not shown, a read head and a write head may further be provided at the central portion of the magnetic layer 300. The read head and write head may be integrally formed, and may be provided at one of either end of the magnetic layer 300, and not at the middle thereof. When such a read head and write head are provided, a semiconductor device consistent with an exemplary embodiment of the present invention is a recording device. If, instead of the read head and the write head, a word line and a bit line for selecting a specific position of the magnetic layer 300 are provided, then a semiconductor device consistent with the present invention is a memory device.

Below, a manufacturing method of a semiconductor device using a magnetic domain wall movement consistent with an exemplary embodiment of the present invention will be described.

FIGS. 3A through 3F are sectional views illustrating the steps of a manufacturing process of a semiconductor device using a magnetic domain wall movement, consistent with an exemplary embodiment of the present invention.

Figure 3A:
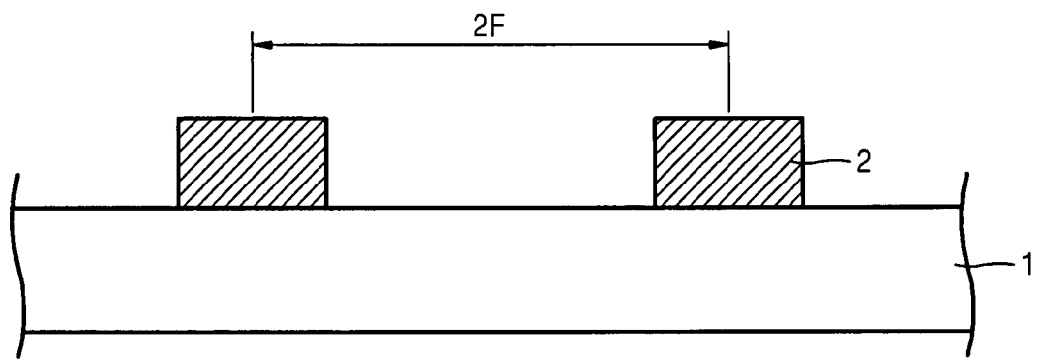
FIGS. 3A through 3F are sectional views illustrating a method of manufacturing a semiconductor device using a magnetic domain wall movement, according to an exemplary embodiment of the present invention.

Referring to FIG. 3A, a dummy pattern 2 is formed on a substrate 1. The dummy pattern 2 may be a pattern of a plurality of lines separated at a regular interval. The material of the dummy pattern 2 may be silicon, and the pitch of the dummy pattern 2 may be 2F, where F is a feature size. In this case, F is the width of a magnetic layer to be formed in a subsequent process, and may be a minimum line width required for an exposing process.

Figure 3B:
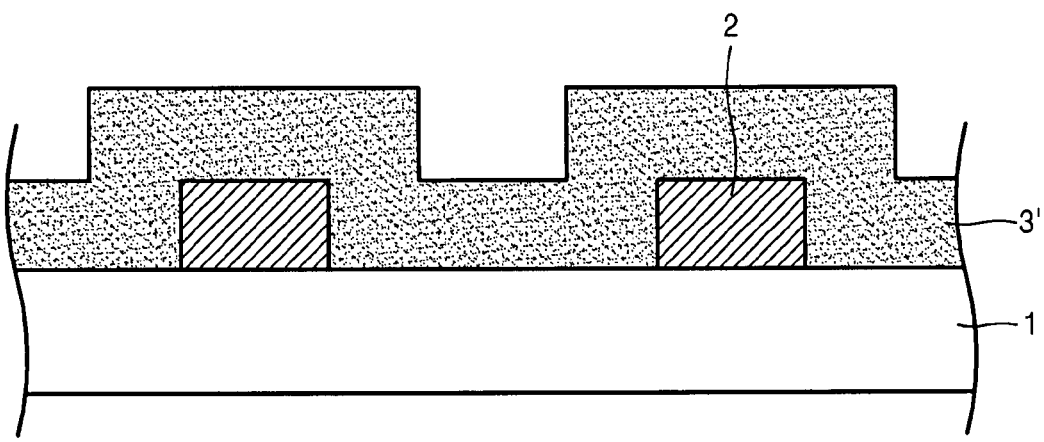

Referring to FIG. 3B, an insulating layer 3' is formed on the substrate 1 to cover the dummy pattern 2. The insulating layer 3' may be a silicon nitride layer ($Si_xN_y$), and may be formed to conform with the surfaces of the substrate 1 and the dummy pattern 2.

Figure 3C:
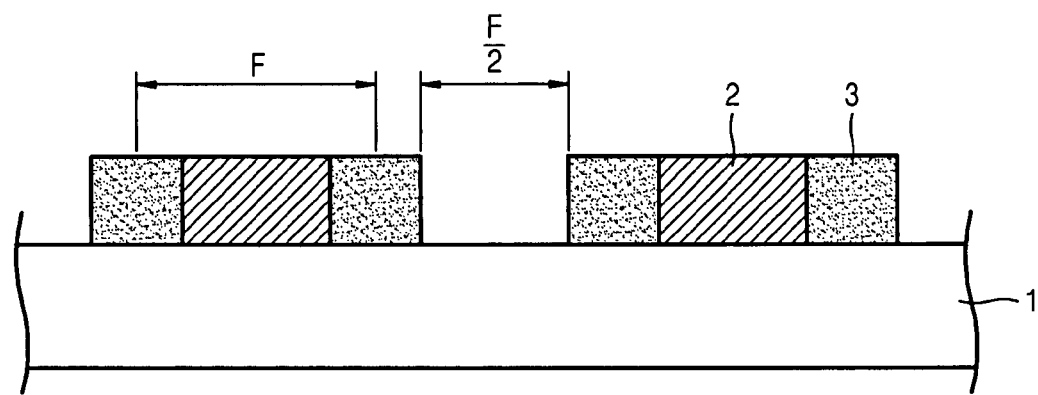

Referring to FIG. 3C, the insulating layer 3' is anisotropically etched, for example, using reactive ion etching (RIE), to expose the upper surface of the dummy pattern 2 and a portion of the substrate 1. Thus, insulating layer patterns 3 are formed on the substrate 1 on either side of the dummy pattern 2. The pitch of the insulating layer patterns 3 is F, and a gap between two insulating layer patterns 3 is F/2.

Figure 3D:
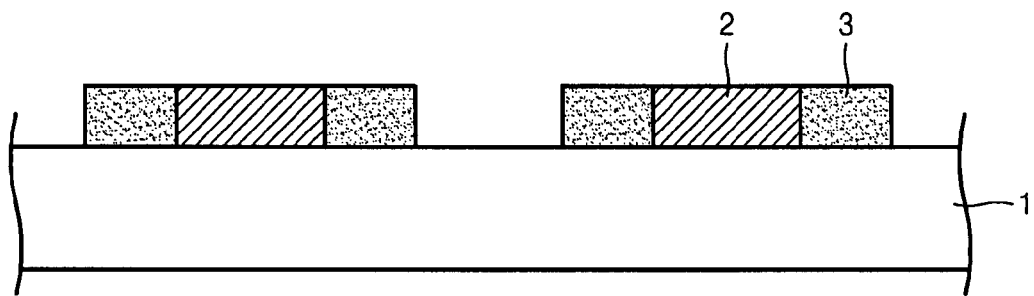

Referring to FIG. 3D, the upper portion of the dummy pattern 2 and the upper portion of the insulating layer patterns 3 are etched using a chemical mechanical polishing (CMP). The CMP is an optional process.

Figure 3E:
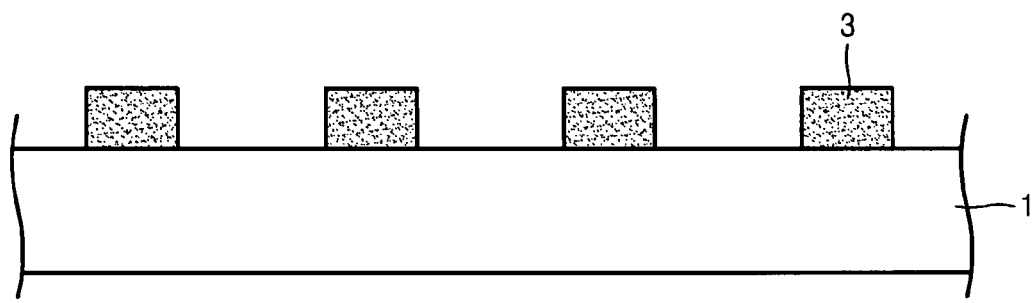

Referring to FIG. 3E, the dummy pattern 2 is removed using a wet or dry etching process. The wet or dry etching is a selective etching process of the dummy pattern 2 made of a silicon material.

Figure 3F:
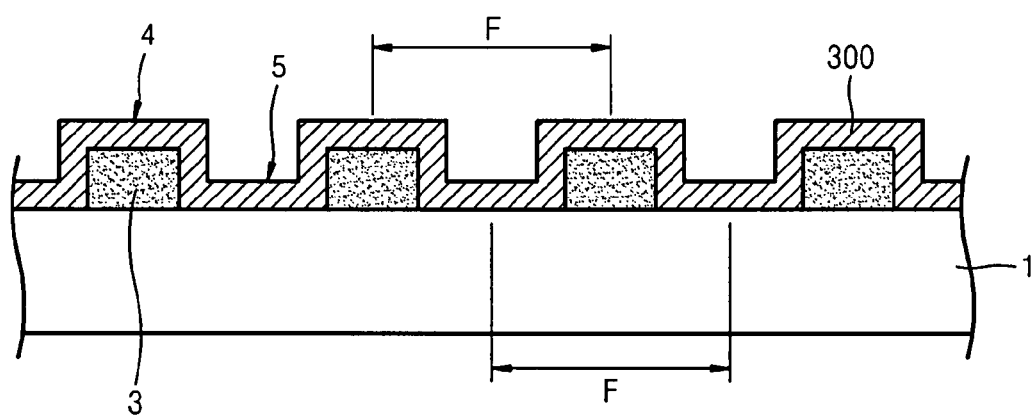

Referring to FIG. 3F, after a magnetic layer 300 is formed on the surfaces of the substrate 1 and the insulating layer patterns 3, the magnetic layer 300 is patterned into lines. The magnetic layer 300 is formed parallel to the substrate 1, and the magnetic layer 300 having a plurality of prominences 4 and a plurality of depressions 5 is formed. The prominences 4 and the depressions 5 are alternately formed along a lengthwise direction of the magnetic layer 300. The pitches of the prominences 4 and that of the depressions 5 are F, and the lengths of the prominences 4 and the depressions 5 are approximately F/2. Here, although not shown, the lengths of the prominences or the depressions at either end of the magnetic layer 300 may be longer than the lengths of the other prominences or depressions. The reason for making the lengths of the prominences or depressions at either end of the magnetic layer 300 longer is to secure contact margins for electrodes that can be formed thereon.

Next, although not shown, a first and a second electrode may be formed on either end of the magnetic layer 300, for moving magnetic domain walls. The means for moving the magnetic domain walls may take other forms.

In above described exemplary embodiment of the present invention, the dummy pattern 2 is used to form the insulating layer patterns 3 with a pitch of F on the substrate 1, and then the magnetic layer 300 is formed on the surfaces of the substrate 1 and the insulating layer patterns 3. Accordingly, the magnetic layer 300 having alternating the prominences 4 and the depressions 5 is formed, where the respective pitches of the prominence 4 and the depression 5 are F, and the lengths of the prominence 4 and the depression 5 are approximately F/2.

In the semiconductor device consistent with the current exemplary embodiment of the present invention, the prominence 4 and the depression 5 are arranged alternately, thereby securing the reliability of the movement of the magnetic domain wall in units of one bit. That is, each stepped portion of the prominences 4 and depressions 5 may perform the same function as the notch in the related art. In this case, the magnetic domain wall is pinned at the stepped portion. On the other hand, the portion excluding the stepped portion, that is, the central portion of the prominence 4 and the central portion of the depression 5 may perform the same function as the notch. In this case, the magnetic domain wall is pinned at the central portions of the prominence 4 and the depression 5. The pinning position of the magnetic domain wall is dependent on the form of the magnetic layer.

Figure 4:
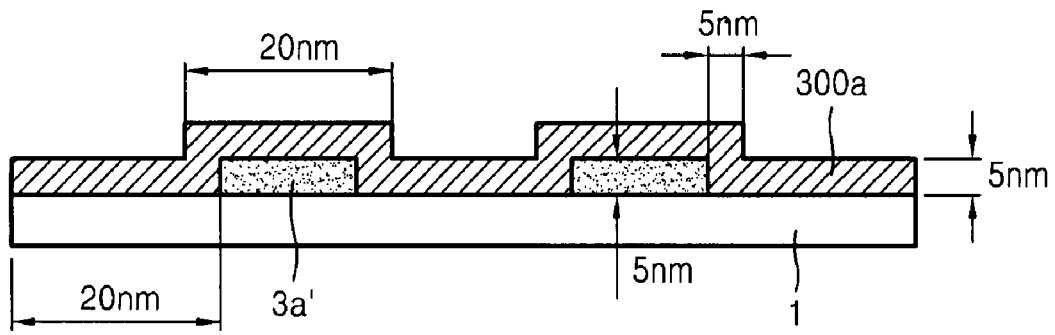
FIGS. 4 through 6 are sectional views illustrating various forms of a magnetic layer of a semiconductor device according to exemplary embodiments of the present invention.
Figure 5:
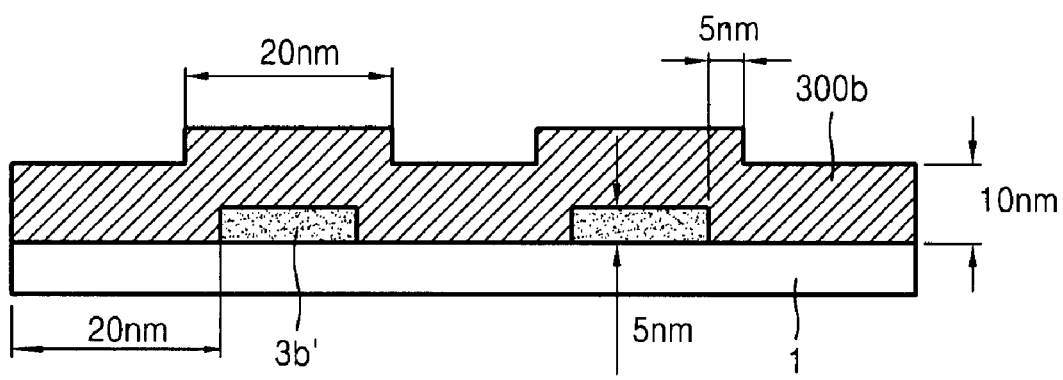
Figure 6:
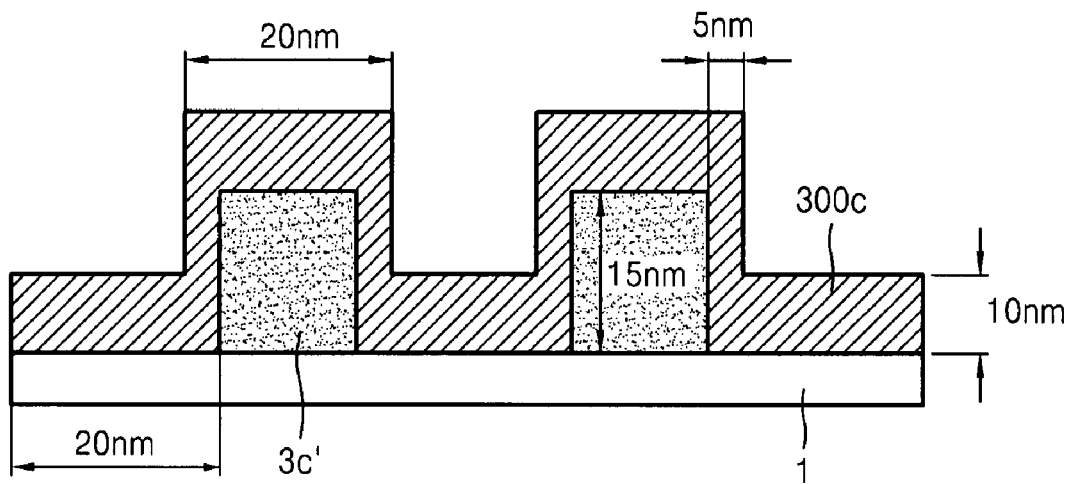

FIGS. 4 through 6 are sectional views illustrating various forms of a magnetic layer of a semiconductor device consistent with exemplary embodiments of the present invention. The sizes of each portion of the magnetic layers 300a, 300b, and 300c and insulating layer patterns 3a', 3b', and 3c' are depicted in the FIGS. 4 through 6. The respective sizes of the parts of the magnetic layers 300a, 300b, and 300c are dependent on the material, forming conditions, and step coverage of the magnetic layers. Reference number 1 in FIGS. 4 through 6 refers to a substrate.

The intrinsic energy of the magnetic layer is a result of an interaction between spin exchange energy, crystal anisotropy energy, and magnetostatic energy. A magnetic domain wall of a concavo-convex magnetic layer has a low energy at a certain location. As described above, the pinning position of the magnetic domain wall may change according to the form of the magnetic layer, so that by adjusting the form of the magnetic layer, the magnetic domain wall can be pinned at a desired location.

When the magnetic domain wall is pinned at the central portion of the prominence (or the depression), the central portion of the prominence (or the depression) is one bit. On the other hand, when the magnetic domain wall is pinned at the stepped portion of the prominence and the depression, the stepped portion is one bit. Thus, in a semiconductor device using the moving of the magnetic domain wall consistent with an exemplary embodiment of the present invention, the magnetic domain wall can be reliably pinned in bit units. Here, the size of a bit may be approximately F×(F/2). When the distance between the magnetic layers is F, the cell size of the semiconductor device consistent with an exemplary embodiment of the present invention is approximately 2F×(F/2) =1F$^2$. The bit and cell sizes of the semiconductor device consistent with this exemplary embodiment of the present invention are roughly half the sizes of the bits and cells that are capable of being formed in processes according to the related art.

FIG. 7 is a partial perspective view of a semiconductor device using a magnetic domain wall movement according to another embodiment of the present invention. Besides there being no insulating layer patterns between the substrate and the magnetic layer of the semiconductor device according to the current embodiment of the present invention, the rest of the structure of the semiconductor device, with the exception of planarization of the lower surface of the magnetic layer, is the same as the structure of the semiconductor structure of the preceding embodiment, as described above with reference to FIG. 2. Therefore, like reference numerals for like elements are used in FIGS. 2 and 7.

Referring to FIG. 7, the lower surface of the magnetic layer 600a of the semiconductor device consistent with this exemplary embodiment of the present invention is planarized. Also, the pitches of the prominences 4 and the depressions 5 may be 1-2 times the width of the magnetic layer 600a.

FIGS. 8A through 8G are sectional views illustrating the steps of a manufacturing process of a semiconductor device using a magnetic domain wall movement, consistent with another exemplary embodiment of the present invention.

Figure 8A:
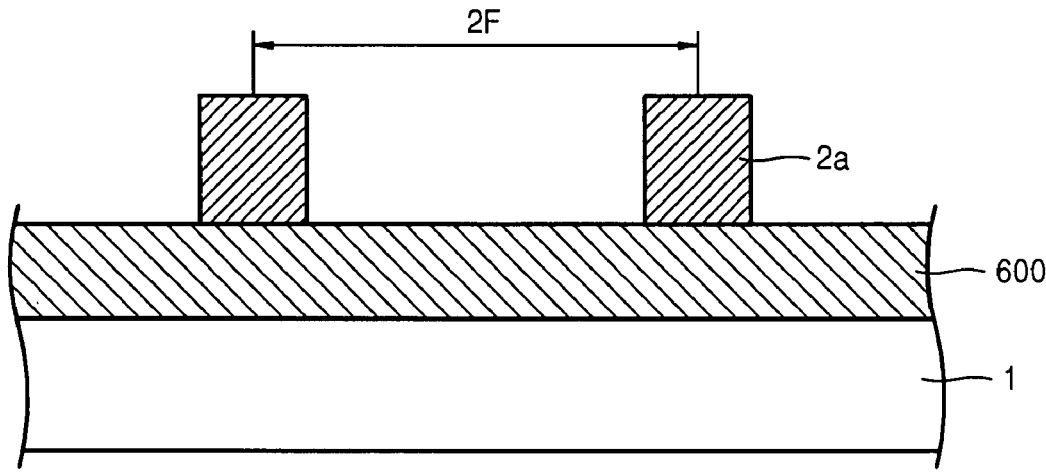
FIGS. 8A through 8G are sectional views illustrating a method of manufacturing a semiconductor device using a magnetic domain wall movement, according to another exemplary embodiment of the present invention.

Referring to FIG. 8A, a magnetic layer 600 of a uniform thickness is formed on a substrate 1. Then, a first pattern 2a is formed on the magnetic layer 600. The first pattern 2a may be a line pattern across the magnetic layer 600, and may be a multi-line pattern with uniformly-spaced lines. The material of the first pattern 2a may be silicon, and the pitch of the first pattern 2a may be 2F.

Figure 8B:
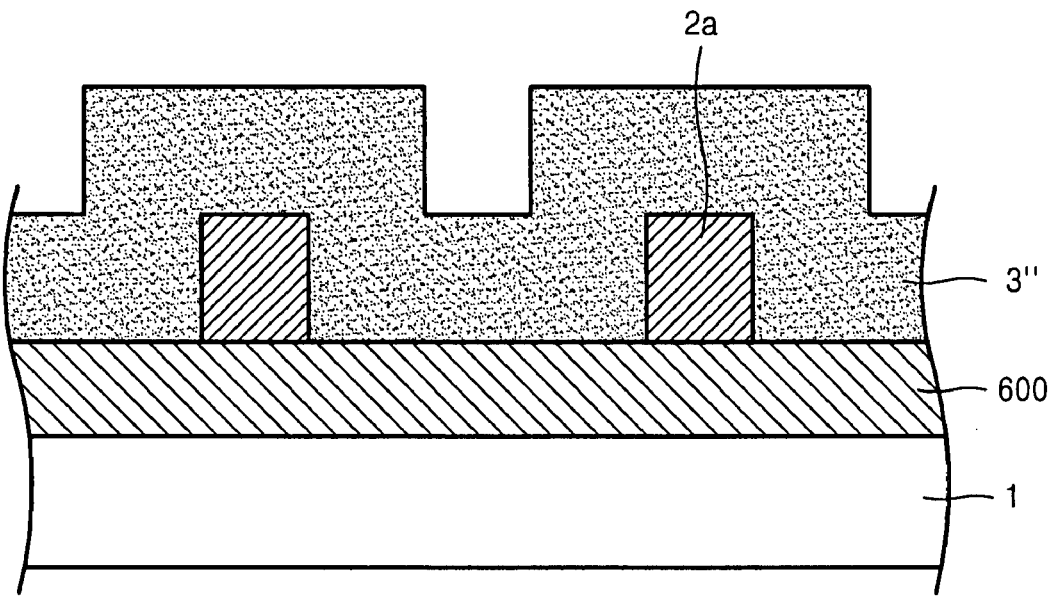

Referring to FIG. 8B, an insulating layer 3" is formed on the magnetic layer 600 to cover the first pattern 2a. The insulating layer 3" may be a silicon nitride ($Si_xN_y$) layer, and may be formed to conform to the surfaces of the magnetic layer 600 and the first pattern 2a.

Figure 8C:
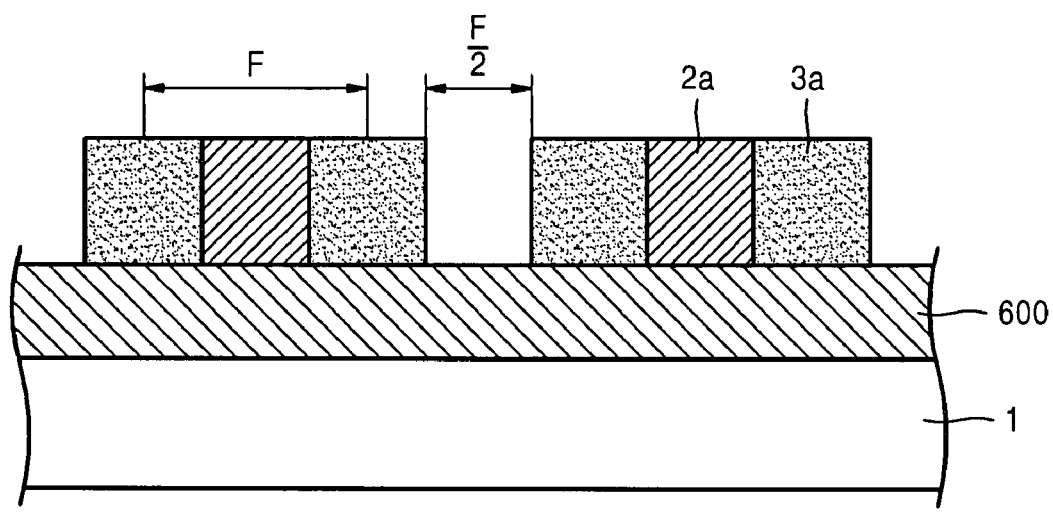

Referring to FIG. 8C, the insulating layer 3" is anisotropically etched using a method such as RIE, to expose the upper surface of the first pattern 2a and a portion of the magnetic layer 600. Thus, a second pattern 3a is formed on the magnetic layer 600 on either side of the first pattern 2a. The pitch of the second pattern 3a is F, and the interval between the second pattern 3a is F/2.

Figure 8D:
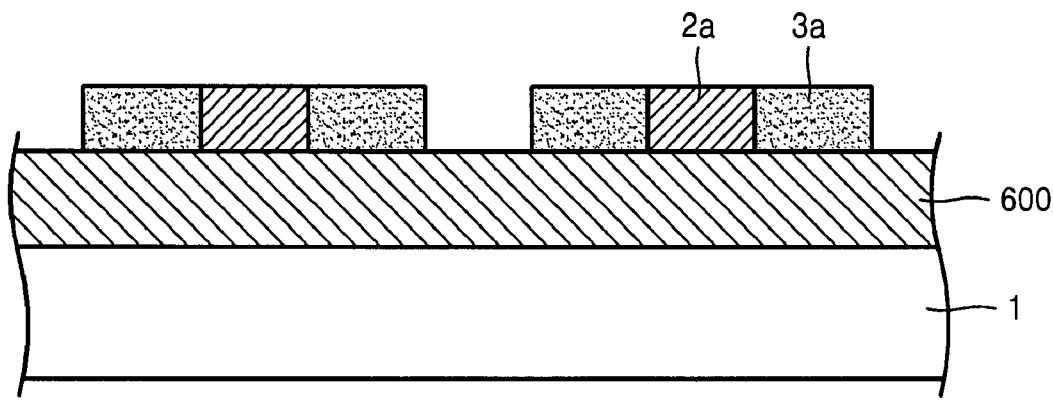

Referring to FIG. 8D, the upper portions of the first pattern 2a and the second pattern 3a are etched through CMP. The CMP is an optional process.

Figure 8E:
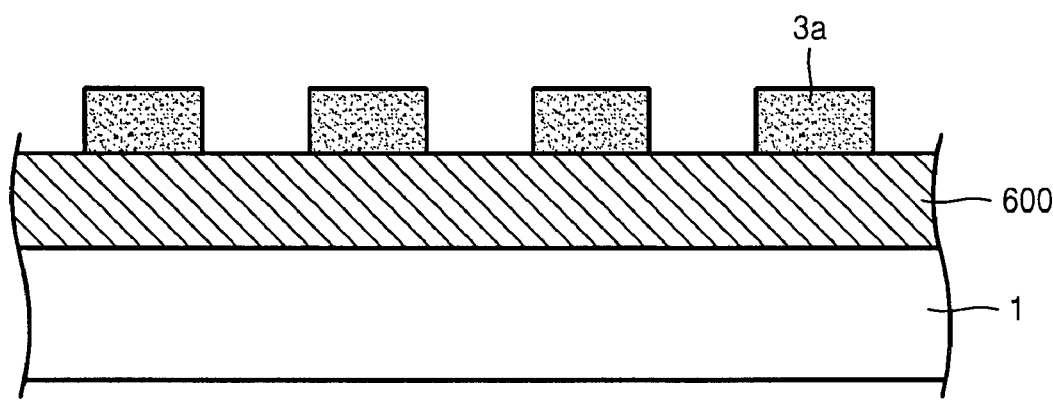

Referring to FIG. 8E, the first pattern 2a is removed through a wet or a dry etching process. The wet or dry etching process selectively etches the first pattern made of a silicon material.

Figure 8F:
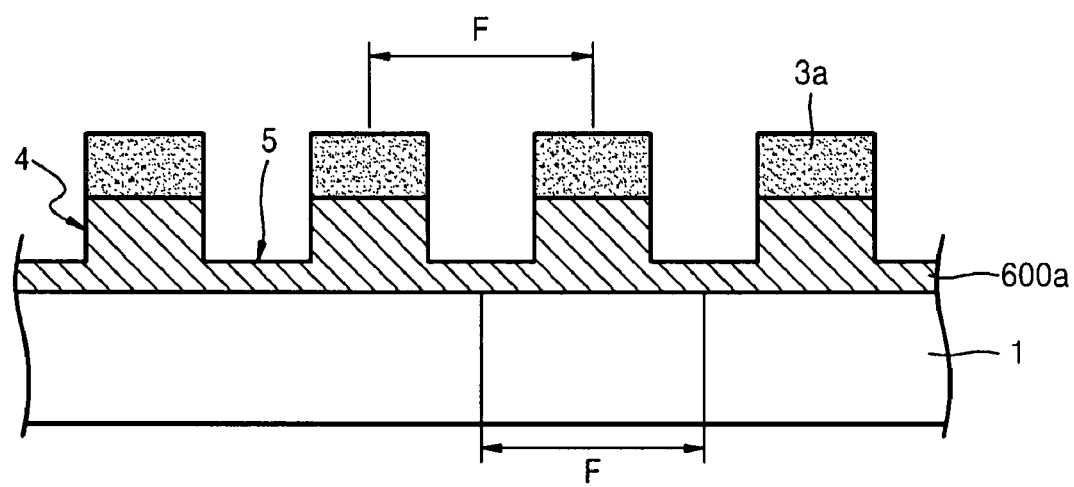

Referring to FIG. 8F, the second pattern 3a is used as an etching mask to etch a portion of the thickness of the magnetic layer 600. Therefore, the magnetic layer 600a having a plurality of prominences 4 and a plurality of depressions 5 is formed when the lower surface is planarized. The prominences 4 and the depressions 5 are alternately arranged along the lengthwise direction of the magnetic layer 600a. The pitch of the prominences 4 and the pitch of the depressions 5 are F, and the length of the prominences 4 and the depressions 5 is approximately F/2. Here, while not shown, the lengths of the prominences or depressions at either end of the magnetic layer 600a may be longer than the lengths of the other prominences or depressions. The reason for forming the prominences or depressions at the ends of the magnetic layer 600a longer than the other prominences or depressions is to secure contact margins for electrodes to be formed thereon.

Figure 8G:
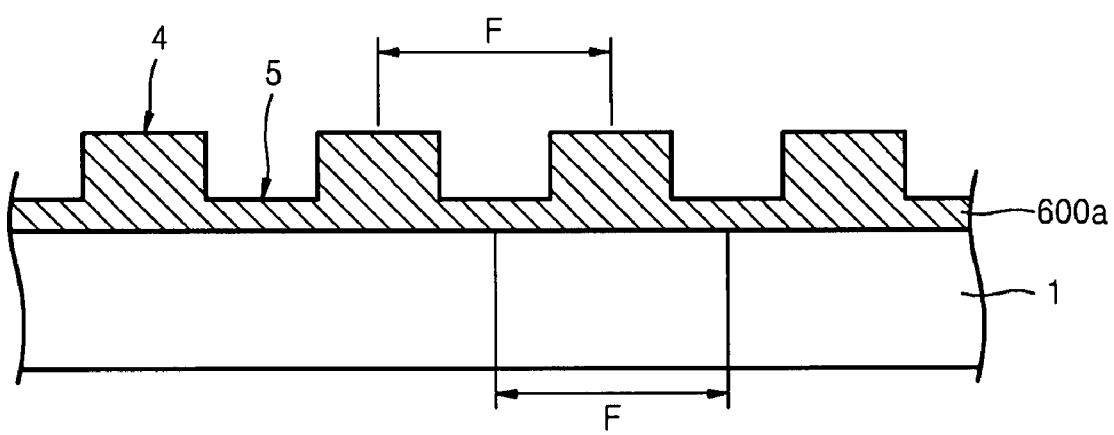

Referring to FIG. 8G, the second pattern 3a is removed. Then, a first and second electrode (not shown) may be formed respectively on either end of the magnetic layer 600a, for moving the magnetic domain wall. An alternate means for moving the magnetic domain wall may be used instead.

In the semiconductor device using movement of magnetic domain walls consistent with the current exemplary embodiment of the present invention, the magnetic domain wall may be reliably moved in a bit unit, in relation to the location of a step of the magnetic layer 600a. However, because the lower surface of the magnetic layer 600a of the semiconductor device consistent with this exemplary embodiment of the present invention is planarized, unlike in the previous embodiments, the entirety of the prominences 4 or the depressions 5 becomes the magnetic domain wall region. Therefore, the cell size of the semiconductor device consistent with this exemplary embodiment of the present invention is smaller than the cell size of semiconductor devices in the previous embodiments of the present invention. Therefore, the manufacturing method of a semiconductor device according to previous embodiments of the present invention is more suited to high integration than methods of these embodiments.

As described above, the magnetic layer of the semiconductor device using the movement of a magnetic domain wall according to the present invention has stepped form. Due to the uniformly protruding magnetic layer, reliable movement of the magnetic domain wall in a bit unit is secured.

After the insulating layer patterns with a pitch of F is formed on the substrate, the magnetic layer is formed to conform to the surfaces of the substrate and the insulating layer patterns, so that a degree of integration is double that of the conventional methods of forming the notch can be obtained. Because the cell size of a semiconductor device according to exemplary embodiments of the present invention is 1F$^2$, when F is 30 nm, a highly integrated semiconductor device having a recording density of 100 GB/cm$^2$ can be manufactured.

Additionally, the present invention is capable of forming a semiconductor device having a highly reliable movement of a magnetic domain wall, avoiding the manufacturing problems and loss of uniformity in device characteristics that result from the forming of a notch in the related art. Because the forming of the notch is difficult, obtaining uniformity thereof is even more difficult. Therefore, a semiconductor device using the movement of the magnetic domain wall consistent with the present invention shows much promise for mass production and reproducibility.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, the semiconductor device consistent with the present invention may be a storage device such as an HDD, a memory device such as a RAM, or a logic device, as required. Also, in each case, additional elements may be more diversified. Moreover, the manufacturing method of the semiconductor device consistent with the present invention is not limited to the above-described methods, and the pitches and forms of the prominences and the depressions may be altered in various ways.

What is claimed is:

1. A semiconductor device comprising:
    a magnetic layer on a substrate and having a plurality of magnetic domains; and
    a unit which supplies energy to move a magnetic domain wall in the magnetic layer; wherein
        the magnetic layer is parallel to the substrate and includes a plurality of prominences and a plurality of depressions alternating along a lengthwise direction of the magnetic layer, and a stepped portion between each prominence and adjacent depression,
        each of the prominences and depressions corresponds to one magnetic domain or one magnetic domain wall, and
        at least one of each of the prominences and each of the depressions is capable of pinning at least one of one magnetic domain and one magnetic domain wall.

2. The semiconductor device of claim 1, further comprising a plurality of insulating layer patterns between the substrate and the prominences.

3. The semiconductor device of claim 2, wherein the magnetic layer conforms to surfaces of the substrate and the insulating layer patterns.

4. The semiconductor device of claim 1, wherein portions of the substrate corresponding to the prominences protrude.

5. The semiconductor device of claim 4, wherein the magnetic layer conforms to a surface of the substrate.

6. The semiconductor device of claim 1, wherein the substrate includes a planarized surface.

7. The semiconductor device of claim 1, wherein prominences or depressions at both ends of the magnetic layer have lengths that are greater than lengths of other prominences or depressions.

8. The semiconductor device of claim 7, wherein the lengths of the prominences or depressions at both ends of the magnetic layer are 1-3 times of a width of the magnetic layer.

9. The semiconductor device of claim 7, wherein the other prominences have pitches that are 1-2 times of a width of the magnetic layer.

10. The semiconductor device of claim 7, wherein the other depressions have pitches that are 1-2 times of a width of the magnetic layer.

11. The semiconductor device of claim 1, wherein a first electrode and a second electrode are at one end and the other end of the magnetic layer, respectively, for supplying a current to the magnetic layer.

12. A semiconductor device comprising:
    a magnetic layer on a substrate and having a plurality of magnetic domains; and
    a unit which supplies energy to move a magnetic domain wall in the magnetic layer; wherein
        the magnetic layer is parallel to the substrate and includes a plurality of prominences and a plurality of depressions alternating along a lengthwise direction of the magnetic layer, and
        each stepped portion between the prominences and the adjacent depressions is a pinning site for one magnetic domain wall or one magnetic domain.

* * * * *